(12) United States Patent
Li et al.

(10) Patent No.: US 11,114,388 B2
(45) Date of Patent: Sep. 7, 2021

(54) WARPAGE CONTROL FOR MICROELECTRONICS PACKAGES

(71) Applicant: INTEL CORPORATION, Santa Clara, CA (US)

(72) Inventors: Eric J. Li, Chandler, AZ (US); Guotao Wang, Chandler, AZ (US); Huiyang Fei, Chandler, AZ (US); Sairam Agraharam, Chandler, AZ (US); Omkar G. Karhade, Chandler, AZ (US); Nitin A. Deshpande, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/280,993

(22) Filed: Feb. 20, 2019

(65) Prior Publication Data

US 2019/0259713 A1    Aug. 22, 2019

Related U.S. Application Data

(63) Continuation of application No. 15/468,067, filed on Mar. 23, 2017, now Pat. No. 10,256,198.

(51) Int. Cl.
*H01L 23/52*  (2006.01)
*H01L 23/00*  (2006.01)
(Continued)

(52) U.S. Cl.
CPC ........ *H01L 23/562* (2013.01); *H01L 23/3121* (2013.01); *H01L 23/3142* (2013.01);
(Continued)

(58) Field of Classification Search
CPC ... H01L 2924/15311; H01L 2224/0401; H01L 2924/3511; H01L 23/49827;
(Continued)

(56) References Cited

U.S. PATENT DOCUMENTS 8,035,035 B2 * 10/2011 Asano ............... H01L 23/49833
174/255
9,859,243 B2 *  1/2018 Lee ..................... H01L 23/3114
(Continued)

*Primary Examiner* — Luan C Thai
(74) *Attorney, Agent, or Firm* — Kacvinsky Daisak Bluni PLLC

(57) ABSTRACT

Techniques for reducing warpage for microelectronic packages are provided. A warpage control layer or stiffener can be attached to a bottom surface of a substrate or layer that is used to attach the microelectronics package to a motherboard. The warpage control layer can have a thickness approximately equal to a thickness of a die of the microelectronics package. A coefficient of thermal expansion of the warpage control layer can be selected to approximately match a CTE of the die. The warpage control layer can be formed from an insulating material or a metallic material. The warpage control layer can comprise multiple materials and can include copper pillar segments to adjust the effective CTE of the warpage control layer. The warpage control layer can be positioned between the microelectronics package and the motherboard, thereby providing warpage control without contributing to the z-height of the microelectronics package.

19 Claims, 11 Drawing Sheets

(51) Int. Cl.
*H01L 23/31* (2006.01)
*H01L 23/498* (2006.01)
*H05K 3/30* (2006.01)
*H05K 3/34* (2006.01)
*H05K 1/18* (2006.01)
*H01L 21/48* (2006.01)

(52) U.S. Cl.
CPC .. *H01L 23/49866* (2013.01); *H01L 23/49894* (2013.01); *H05K 1/181* (2013.01); *H05K 3/301* (2013.01); *H05K 3/3436* (2013.01); H01L 21/4853 (2013.01); H01L 23/49816 (2013.01); H01L 23/49833 (2013.01); H01L 24/16 (2013.01); H01L 2224/131 (2013.01); H01L 2224/16225 (2013.01); H01L 2224/73204 (2013.01); H01L 2924/3511 (2013.01); H05K 2201/10378 (2013.01); H05K 2201/10734 (2013.01)

(58) Field of Classification Search
CPC ....... H01L 2924/19103; H01L 21/4853; H01L 23/49816; H01L 23/562; H01L 23/49833; H01L 23/49866; H01L 23/3121; H01L 23/3142; H01L 23/49894; H05K 1/181; H05K 3/301; H05K 3/3436
USPC ........ 257/678, 701, 702, 703, 738, 778–780
See application file for complete search history.

(56) References Cited

U.S. PATENT DOCUMENTS

| 2005/0230841 | A1* | 10/2005 | Walk | H01L 23/49827 257/778 |
| 2014/0048951 | A1* | 2/2014 | Lin | H01L 23/481 257/774 |
| 2014/0084467 | A1* | 3/2014 | Nalla | H01L 23/552 257/741 |
| 2016/0254220 | A1* | 9/2016 | Lin | H01L 23/49822 257/668 |
| 2017/0127517 | A1* | 5/2017 | Ishihara | H05K 3/4007 |

* cited by examiner

FIG. 10
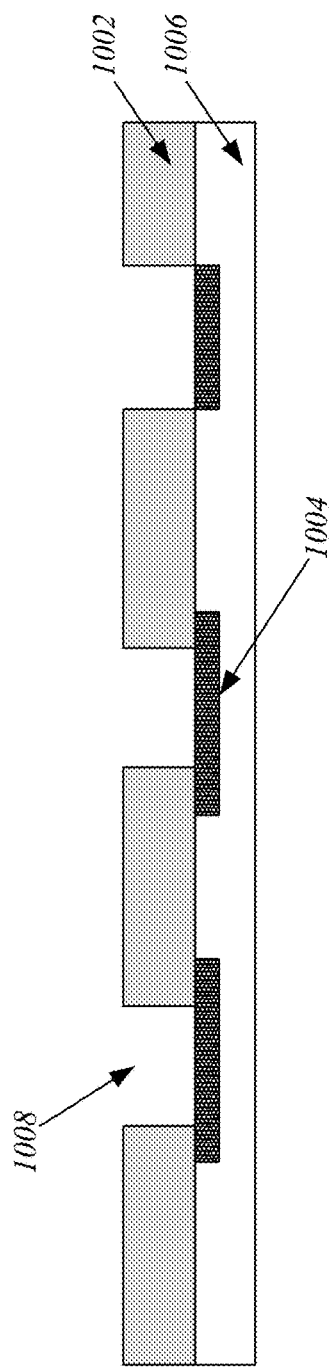
FIG. 10D
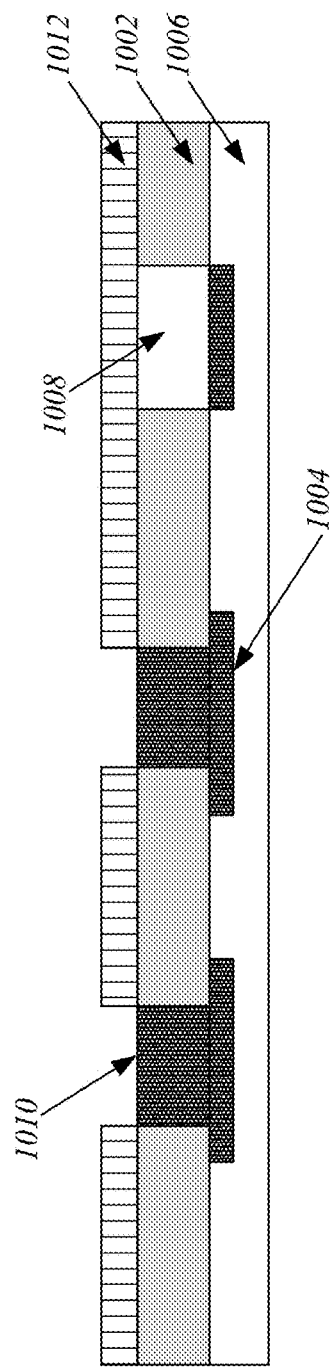
FIG. 10E
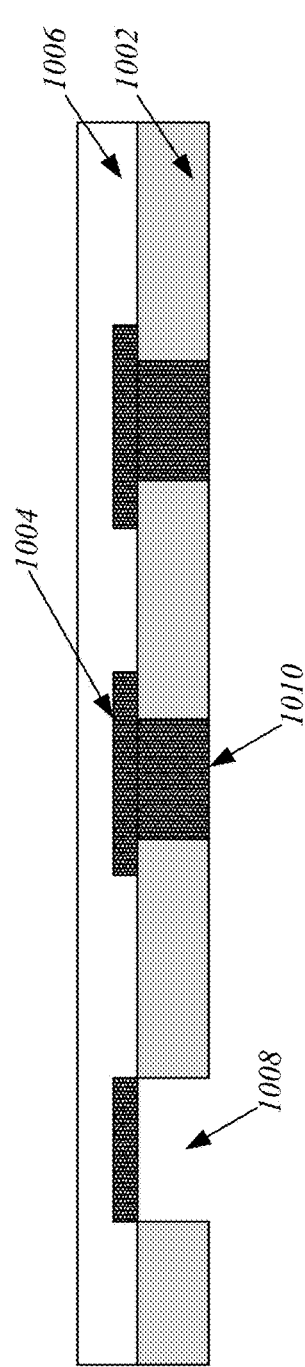
FIG. 10F

*1100*

WARPAGE CONTROL FOR MICROELECTRONICS PACKAGES

CROSS-REFERENCE TO RELATED APPLICATIONS

This application is a continuation of, claims the benefit of and priority to previously filed U.S. patent application Ser. No. 15/468,067 filed Mar. 23, 2017, entitled "WARPAGE CONTROL FOR MICROELECTRONICS PACKAGES", which application is hereby incorporated by reference in its entirety.

TECHNICAL FIELD

Embodiments described herein generally relate to microelectronic package fabrication. More particularly, embodiments described herein relate to reducing warpage of microelectronic packages.

BACKGROUND

Microelectronic packages are generally required to have a low z-height and low warpage to allow for solder mount onto a motherboard and reliable operation thereafter. A package-on-package (PoP) architecture that includes a memory component mounted on top of a die of the microelectronic package increases the height of the microelectronic package, thereby making a low z-height requirement more challenging.

A first conventional technique for reducing warpage involves adding core material to an organic substrate of the microelectronic package in order to reduce the coefficient of thermal expansion (CTE) of the organic substrate. This technique, however, tends to significantly increase the z-height of the resulting microelectronics package.

Other conventional techniques for reducing warpage involve adding either a metal stiffener or an organic substrate interposer on top of the die of the microelectronic package. These techniques not only significantly increase the z-height of the microelectronics package but also introduce significant processing challenges for attaching these additional layers on top of the die and managing the reliability of the interfaces. Further, these techniques can result in the consumption of valuable real estate on the package surface which can lead to an even larger package that can exacerbate warpage issues and also increase costs.

Coreless substrates are often used in microelectronic packages to reduce z-height. However, use of coreless substrates can lead to increased warpage of the microelectronics package. Conventional techniques for reducing warpage of microelectronics packages that include coreless substrates generally increase the z-height or introduce additional complex processing steps.

Accordingly, new techniques for reducing warpage of microelectronics packages that may include coreless substrates while maintaining a low z-height may be needed.

BRIEF DESCRIPTION OF THE DRAWINGS

FIGS. 10A-F illustrate a process for fabricating a portion of the microelectronics package depicted in FIG. 8.

DETAILED DESCRIPTION

Various embodiments may be generally directed to reducing warpage for microelectronic packages. A warpage control layer or stiffener can be attached to a bottom surface of a substrate or layer that is used to attach the microelectronics package to a motherboard. The warpage control layer can have a thickness approximately equal to a thickness of a die of the microelectronics package. A coefficient of thermal expansion of the warpage control layer can be selected to approximately match a CTE of the die. The warpage control layer can be formed from an insulating material or a metallic material. The warpage control layer can comprise multiple materials and can include copper pillar segments to adjust the effective CTE of the warpage control layer. The warpage control layer can be positioned between the microelectronics package and the motherboard, thereby providing warpage control without contributing to the z-height of the microelectronics package.

Various embodiments may comprise one or more elements. An element may comprise any structure arranged to perform certain operations. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Figure 1:
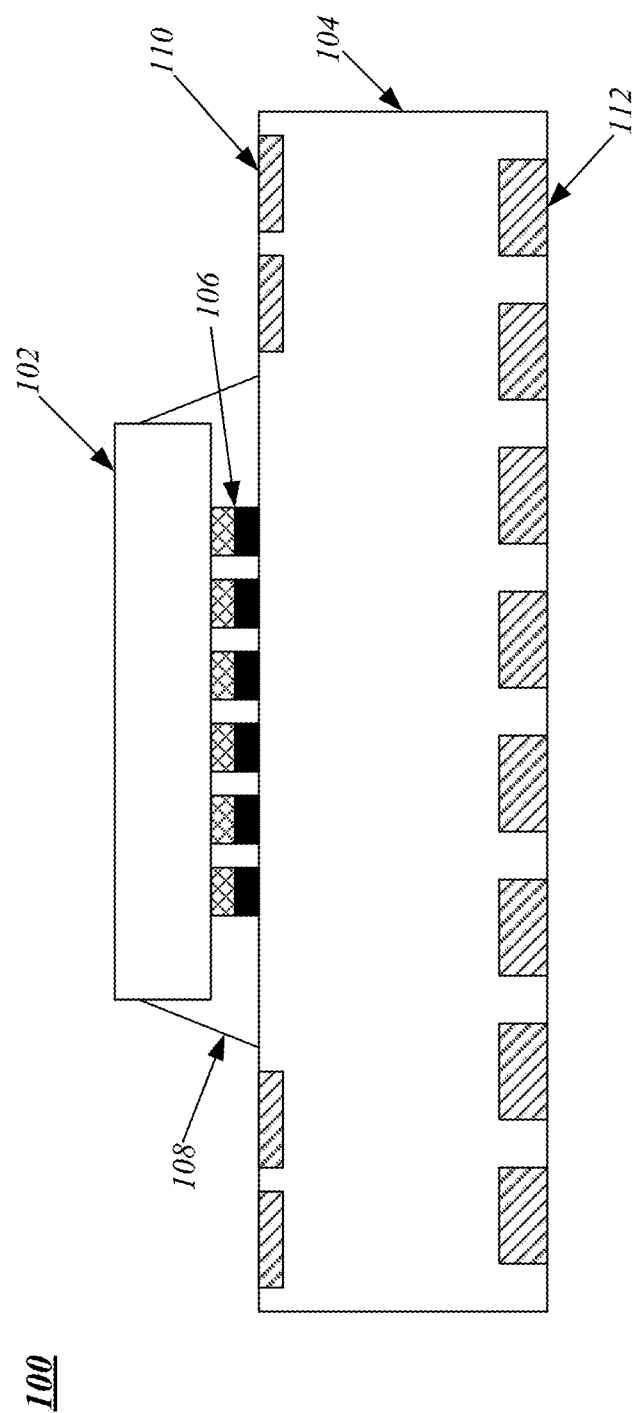
FIG. 1 illustrates a side view of an embodiment of a microelectronics package in a first phase of fabrication.

FIG. 1 illustrates a package or structure 100. The package 100 can be semiconductor package or structure. The package 100 can be an integrated circuit (IC) package such as a central processing unit (CPU) and/or can be a microelectronics package or structure. FIG. 1 illustrates the package 100 in a first phase of formation or fabrication.

The package 100 can include a die 102 and a substrate 104. The substrate 104 can be a coreless substrate or a cored substrate. In various embodiments described herein, the substrate 104 is considered to be a coreless substrate 104. The die 102 can be a microelectronics semiconductor die such as, for example, a silicon die. The die 102 can be coupled or attached to the coreless substrate 104. The die 102 can be connected to the coreless substrate 104 by one or more connectors 106. The connectors 106 can include, for example, connectors extending from the die 102 and/or solder balls positioned between the die 102 and the coreless substrate 104. The package 100 can further include an underfill 108 positioned between the die 102 and the coreless substrate 104.

The coreless substrate 104 can include package-on-package (PoP) lands or connection pads 110. The PoP lands 110 can be positioned on a top surface of the coreless substrate 104. The PoP lands 110 can be positioned on either side of the die 102. The PoP lands 110 can be formed from a conductive material.

The coreless substrate 104 can further include ball grid array (BGA) lands or connection pads 112. The BGA lands 112 can be positioned on a bottom surface of the coreless substrate 104. The BGA lands 112 can be arranged in any type of pattern or array. The BGA lands 112 can be distributed across an entirety of the bottom surface of the coreless substrate 104 or a portion thereof. The BGA lands 112 can be formed from a conductive material.

The die 102 can be attached to the coreless substrate 104 using standard chip attach and underfill processes. A thickness of the die 102 can be selected based on PoP pitch and assembly yield. As an example, the thickness of the die 102 can be on the order of approximately 100 µm for a PoP pitch of approximately 300-400 µm.

Figure 2:
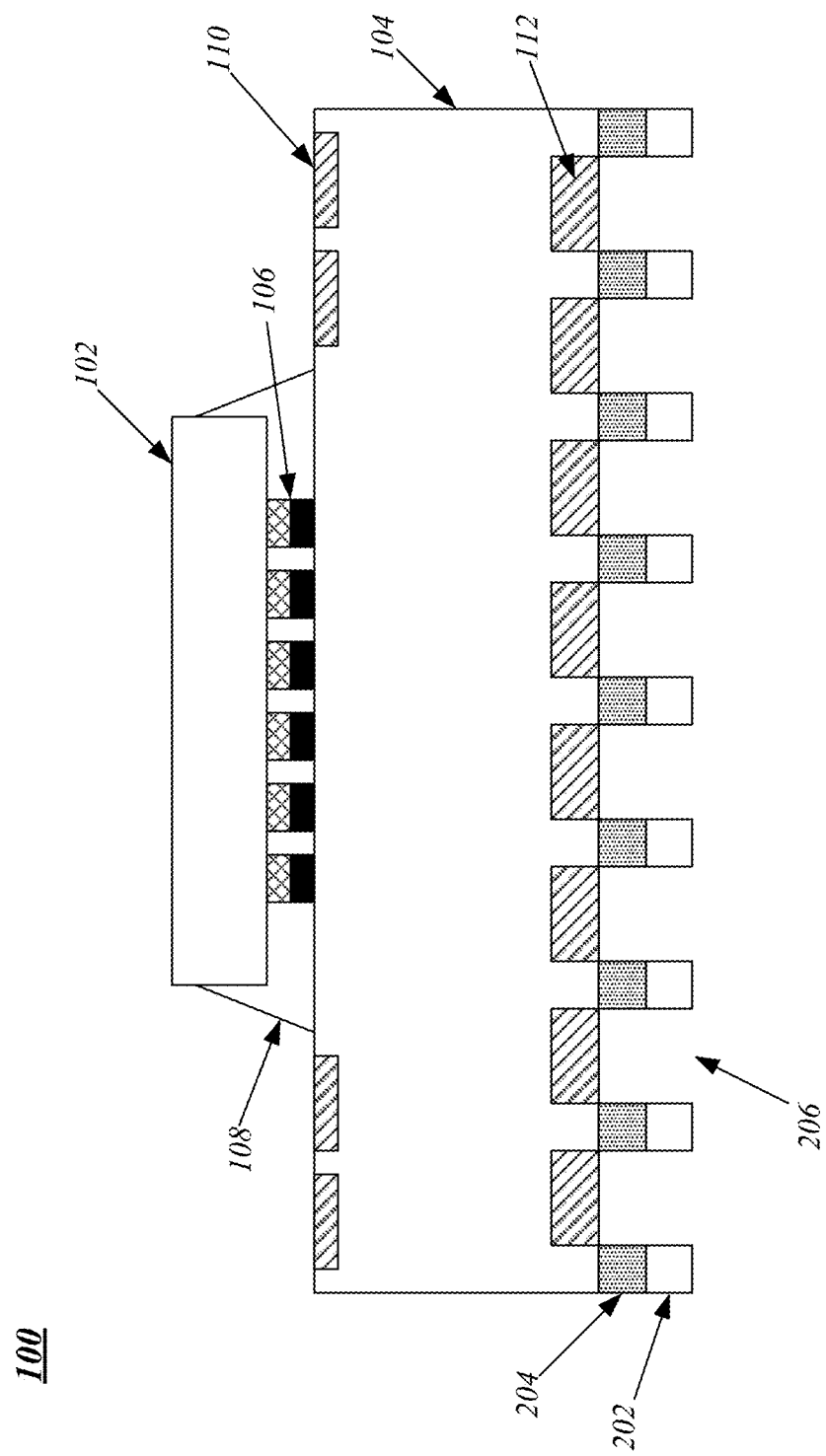
FIG. 2 illustrates a side view of the embodiment of a microelectronics package depicted in FIG. 1 in a second phase of fabrication.

FIG. 2 illustrates the package 100 in a second phase of formation or fabrication, for example, subsequent to the processing phase shown in FIG. 1. As shown in FIG. 2, the package 100 can additionally include a stiffener 202 attached to the coreless substrate 104 by an adhesive 204. The stiffener 202 and the adhesive 204 can be positioned on the bottom surface of the coreless substrate 104 on portions of the bottom surface that do not include the BGA lands 112. As a result, open areas or openings 206 can be formed adjacent to the attached portions of the stiffener 202 and the adhesive 204 and above the BGA lands 112. In a subsequent phase of formation or processing, to be discussed in more detail below, the open areas 206 can be formed so as to later accept solder for attachment to a motherboard or other electronics board.

According to various embodiments, a choice of material, a thickness, and/or other properties of the stiffener 202 can be selected based on the structure of the package 100 to achieve a desired warpage control for the package 100. The thickness of the die 102 can be used to determine one or more of the choice of material, the thickness, and/or the other properties of the stiffener 202. The stiffener 202 can be made from a variety of materials including, for example, stainless steel, silicon, and glass. The choice of material for the stiffener 202 can be based on cost and desired warpage control.

The stiffener 202 can be used to mechanically balance out the die 102 attached to the top of the coreless substrate 104. Accordingly, the thickness of the stiffener 202 can be on the same order as the die 102, or can have a thickness approximately equal to a thickness of the die 102. Further, a coefficient of thermal expansion (CTE) of the stiffener 202 can be selected to approximately match the CTE of the die 102. The stiffener 202 can be positioned on the underside of the coreless substrate 104 and above a motherboard or other electronics board. As such, a thickness of the stiffener 202 can be designed to fit within a pre-existing space or gap between the bottom of the coreless substrate 104 and a motherboard or other electronics board to which the package 100 is to be connected. As an example, the thickness of the stiffener 202 can be minimized to fit within the BGA space reserved for underneath the coreless substrate 104.

In various embodiments, the stiffener 202 can be selected from an insulating material. For example, the stiffener 202 can be a silicon or glass material. When an insulating material is selected for use as the stiffener 202, adhesive lamination on top of the stiffener 202 can be performed (e.g., as shown in FIG. 2). Specifically, the insulating material selected for use as the stiffener 202 can be coupled to the coreless substrate 104 using an adhesive (e.g., the adhesive 204 as shown in FIG. 2). Selection of the adhesive 204 can be based on ensuring adequate mechanical coupling between the stiffener 202 and the coreless substrate 104 after a curing process used to promote adhesion using the selected adhesive.

Further, for a stiffener 202 that is an insulating material, formation of the open spaces 206 as shown in FIG. 2 can be performed after the stiffener 202 is attached to the coreless substrate 104. That is, an insulating stiffener 202 can be mechanically attached to the entire bottom surface of the coreless substrate 104 using the adhesive 204 such that the adhesive 204 and the insulating stiffener 202 cover the BGA lands 112. During a subsequent processing step, the openings 206 can be formed. As an example, laser drilling can be used to form the open spaces 206. In various embodiments, the pattern of the laser drilling can be consistent with the BGA design for the underside of the coreless substrate 104. Further, a diameter of one or more of the openings 216 formed by laser drilling can be made to be slightly larger than the BGA ball size diameter (e.g., a diameter of the BGA lands 112). In various embodiments, formation of the open spaces 206 can be performed before the insulating stiffener 202 is attached to the coreless substrate 104. That is, the openings 206 can be formed in the insulating stiffener 202 and then laminating the adhesive 204 onto the insulating stiffener 202 for attachment to the coreless substrate 104.

In various embodiments, the stiffener 202 can be selected from a conductive material. For example, the stiffener 202 can be a metallic material such as stainless steel. When a metallic material is selected for use as the stiffener 202, the openings 206 can be formed into the metallic stiffener 202 prior to the metallic stiffener 202 being adhered to the coreless substrate 104. For example, a metallic stiffener 202 can be first subjected to a laser drilling process to create openings in the metallic stiffener 202 to correspond with the openings 206 shown in FIG. 2. The laser drilling process can be used to form the openings 206 for the BGA. After laser drilling, a coating process can be implemented to cover the metallic stiffener 202 with an insulating and stable barrier.

After the coating process, the metallic stiffener 202 can undergo an adhesive lamination process. In various embodiments, an adhesive can be used to adhere the metallic stiffener 202 to the underside of the coreless substrate 104. During the adhesive lamination process, an adhesive layer can be formed over the BGA openings 206. This thin adhesive layer can be removed during a subsequent processing step by way of a punching process or a laser ablation process. Whether an insulating stiffener 202 or a metallic stiffener 202 is used, the package 100 can undergo a curing process to cure the selected adhesive to ensure mechanically stable coupling of the stiffener 202 to the coreless substrate 104. The coreless substrate 104 can be considered to be an intermediate substrate as it is positioned between the die 102 and the stiffener 202.

Figure 3:
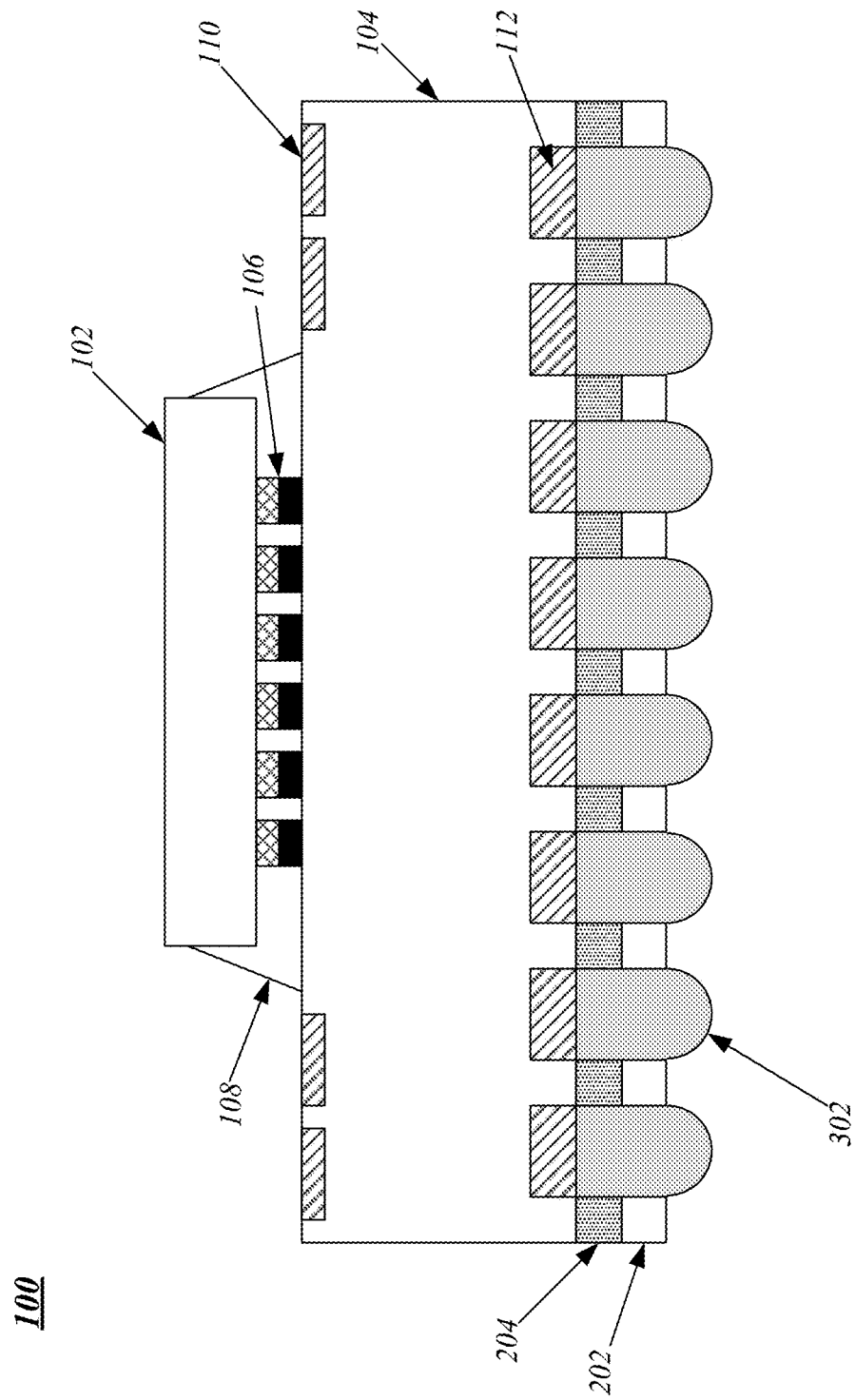
FIG. 3 illustrates a side view of the embodiment of a microelectronics package depicted in FIGS. 1 and 2 in a third phase of fabrication.

FIG. 3 illustrates the package 100 in a third phase of formation or fabrication, for example, subsequent to the processing phase shown in FIG. 2. As shown in FIG. 3, the package 100 can additionally include solder balls 302. The solder balls 302 can form a BGA. The solder balls 302 can be positioned over the BGA lands 112 and between the portions of the stiffener 202 and the adhesive 204 positioned between the BGA lands 112. The solder balls 302 can be used to attach the package 100 to a motherboard or other electronics board.

The solder balls 302 can be attached during a ball attach process. The ball attach process can be a flux printing process or a flux spray process that can be followed by a standard ball placement and reflow process. Flux printing may be possible due to the relatively low thickness of the stiffener 202.

As an example ball attach process, for an approximately 400 µm BGA pitch, a standard 9 mil solder ball can have a height of approximately 170 µm post reflow. This ball height can be sufficient to accommodate a combination of the stiffener 202 and the adhesive 204 having a combined thickness of approximately 100 µm. In various embodiments, the openings 206 between the stiffener portions 202 can help prevent solder from bridging between adjacent solder balls 302. As a result, relatively larger solder balls 302 can be used which, in turn, can provide even more space between the coreless substrate 104 and the board to which it will attach.

After a ball attach process (e.g., as shown in FIG. 3), the package 100 can undergo a flux dipping and pickup and placement process during which the package 100 (e.g., as a CPU) can be positioned on an electronics board (e.g., a motherboard). Memory packages can also be placed on top of the package 100 followed by mass reflow.

The use of the stiffener 202 can reduce the space available for the BGA solder balls 302 to collapse between the package 100 and the electronics board to which it will attach (not shown in FIG. 3 for simplicity). However, the improved warpage control provided by the stiffener 202 can ensure acceptable or improved surface-mount technology (SMT) yield.

The package 100 and the techniques described herein can provide for warpage control over a wide range of temperatures. The coreless substrate can have a relatively high CTE while the die 102 can have a relatively low CTE. Due of this CTE mismatch, absent the stiffener 202, warpage can be significant for any die attached to any coreless substrate. The package 100 and the techniques described herein can balance the CTE of the die 102 with a stiffener 202 on the other side of the coreless substrate 104, thereby significantly reducing warpage experienced by the package 100.

Further, by placing the stiffener 202 on the bottom surface of the coreless substrate 104, the z-height of the package 100 can remain relatively low and lower than other packages that include coreless substrates that attempt to control warpage by using techniques limited to the same side on which the die is positioned. Overall, the package 100 and the techniques described herein can create a symmetrical mechanical configuration of die 102—coreless substrate 104—stiffener 202 to enable improved warpage control at both room temperature and reflow temperature. Further, the package 100 and the techniques described herein can utilize the existing space between the coreless substrate 104 and the electronics board with little to no impact to the z-height of the package 100. In various embodiments, the stiffener 202 can be considered to be a warpage control layer intended to improve the warpage of an arrangement (e.g., the package 100) to which it is a part.

The package 100 and the techniques described herein provide numerous advantages over conventional techniques for warpage control in packages that use coreless substrates or cored substrates. First, the symmetrical configuration of the package 100 (e.g., the die 102—the coreless substrate 104—the stiffener 202 configuration as depicted in FIGS. 1-3) can provide improved warpage control capability with low complexity. Second, warpage control can be provided at all temperatures (e.g., room temperature and reflow temperature). Third, by placing the stiffener 202 on the bottom of the coreless substrate 104, the z-height of the package 100 can be unaffected or even reduced. Fourth, the coreless substrate 104 can be provided with first level interconnect (FLI) scaling capability even with the lowest possible z-height. Fifth, the assembly process can be simplified by eliminating complex processing steps while still providing a PoP architecture. Lastly, flexibility in design choices is afforded by choices in material type, thicknesses, and mechanical properties of the stiffener 202 to balance the die 102 on the top of the coreless substrate 104.

Figure 4:
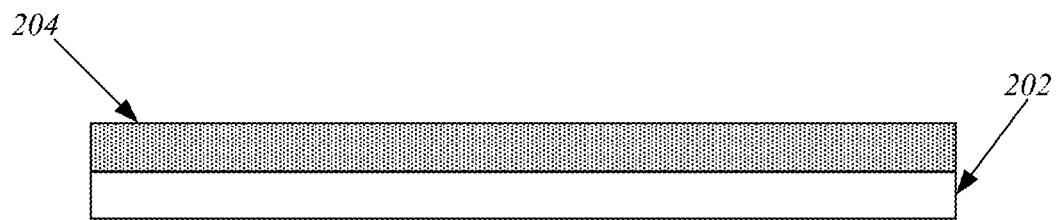
FIG. 4 illustrates a side view of a stiffener and an adhesive included in the embodiment of the microelectronics package depicted in FIGS. 2 and 3.

FIG. 4 illustrates a representative side view of the stiffener 202 and the adhesive 204 prior to undergoing a process for forming openings to accommodate a BGA. As described above, the stiffener 202 can comprise an insulating material (e.g., glass or silicon) or can comprise a metallic material (e.g., stainless steel).

Figure 5A:
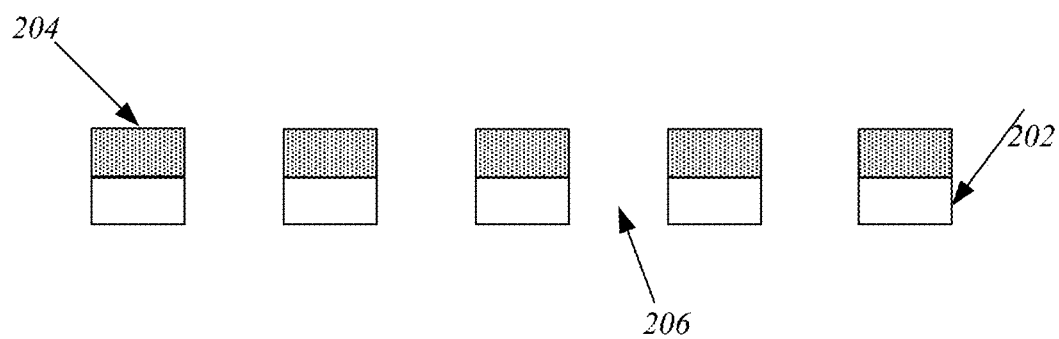
FIG. 5A illustrates a side view of the stiffener and the adhesive depicted in FIG. 4 after undergoing a process for forming openings to accommodate a ball grid array (BGA).

FIG. 5A illustrates a representative side view of the stiffener 202 and the adhesive 204 after undergoing a process for forming openings to accommodate a BGA. As shown in FIG. 5A, the process can form openings 206. The openings 206 can be formed in positions corresponding to or aligned with BGA landings provided on a bottom side of the coreless substrate 104. The process for forming the openings can include a laser drilling process.

Figure 5B:
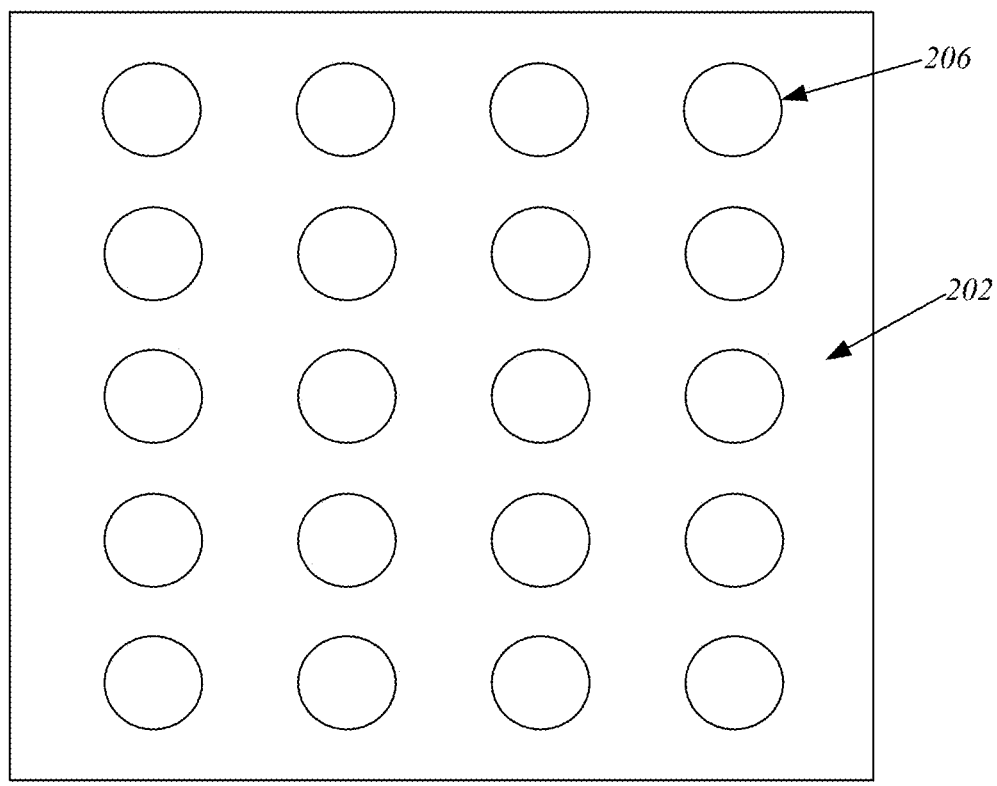
FIG. 5B illustrates a bottom view of the stiffener and the adhesive depicted in FIG. 5B.

FIG. 5B illustrates a bottom view of the stiffener 202 and the adhesive 204 after undergoing a process for forming openings to accommodate a BGA. As shown in FIG. 5B, the openings 206 can form a pattern consistent with a BGA design for the underside of the coreless substrate 104. The diameters of the openings 206 can each be of generally the same approximate size and can be designed to be slightly larger than the expected BGA ball size diameter.

Figure 6:
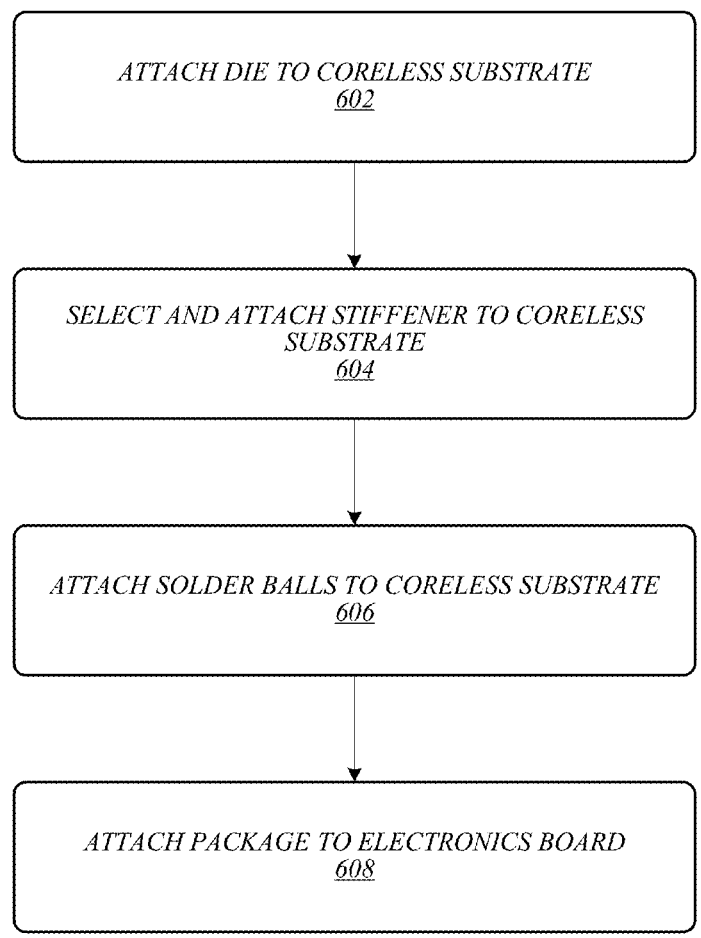
FIG. 6 illustrates an embodiment of a first logic flow.

FIG. 6 illustrates an example of a logic flow 600 that may be representative of a process for forming or fabricating a package having improved warpage control and low z-height. For example, logic flow 600 may be representative of operations that may be performed to form the package 100 as shown and described in relations to FIGS. 1-5.

At 602, a die can be attached to a substrate. The die can be a silicon die. The substrate can be a cored substrate or a coreless substrate. In various embodiments, the substrate can be a coreless substrate. The coreless substrate can include PoP lands and can include BGA lands. The die thickness can be based on PoP pitch and assembly yield. A standard chip attach and underfill process can be used to attach the die to the coreless substrate.

At 604, a stiffener can be selected and attached to a bottom surface of the coreless substrate. The stiffener can be selected based a thickness of the die and a desired warpage control. The stiffener can have a CTE that is similar to the CTE of the die. A thickness of the stiffener can be similar or approximately the same as the thickness of the die. The stiffener can be attached to the bottom surface of the coreless substrate using an adhesive that can be cured during a curing process.

The stiffener can comprise an insulating material (e.g., silicon or glass) or can comprise a metallic material (e.g., stainless steel). If an insulating stiffener is selected, an adhesive lamination process can be used to attach the stiffener to the underside of the coreless substrate. Once attached, the insulating stiffener can undergo a laser drilling process to create openings to enable ball attach in a subsequent operation.

If a metallic stiffener is selected, then a laser drilling process can be performed prior to attaching the metallic stiffener to the coreless substrate. After undergoing a laser drilling process to form openings to enable ball attach in a subsequent operation, the metallic stiffener can undergo a coating process to create an insulating layer over an entirety of the metallic stiffener. Subsequent to the coating process, the metallic stiffener can undergo an adhesive lamination process to mechanically attach the metallic stiffener to the coreless substrate. Any additional adhesive layer remaining over openings intended for ball attach can be removed through a punching process or another laser ablation process.

Whether a metallic or insulating stiffener is used, the pattern of laser drilling can be consistent with a BGA design. Further, the diameter of the openings formed by the laser drilling process can be slightly larger than the diameter of the BGA ball size. Further, a curing process can be used to cure the adhesive selected for adhering the stiffener to the coreless substrate.

At 606, solder balls can be attached to the coreless substrate. The solder balls can be attached according to the BGA design and within the openings in the stiffener provided by the laser drilling process. The solder balls can be attached using, for example, a flux printing or a flux spray operation followed by a standard ball placement and reflow process. The solder balls can be deposited so as to be attached or coupled to the BGA lands provided on the coreless substrate.

At 608, the package can be attached to an electronics board. As an example, the die-coreless substrate-stiffener package can be attached to a motherboard. As part of this process, the package can undergo a flux dipping and pick up and place operation to position the package precisely onto a motherboard. Subsequent to placement on a motherboard, one or more memory packages can be attached to the package using the PoP lands.

Figure 7:
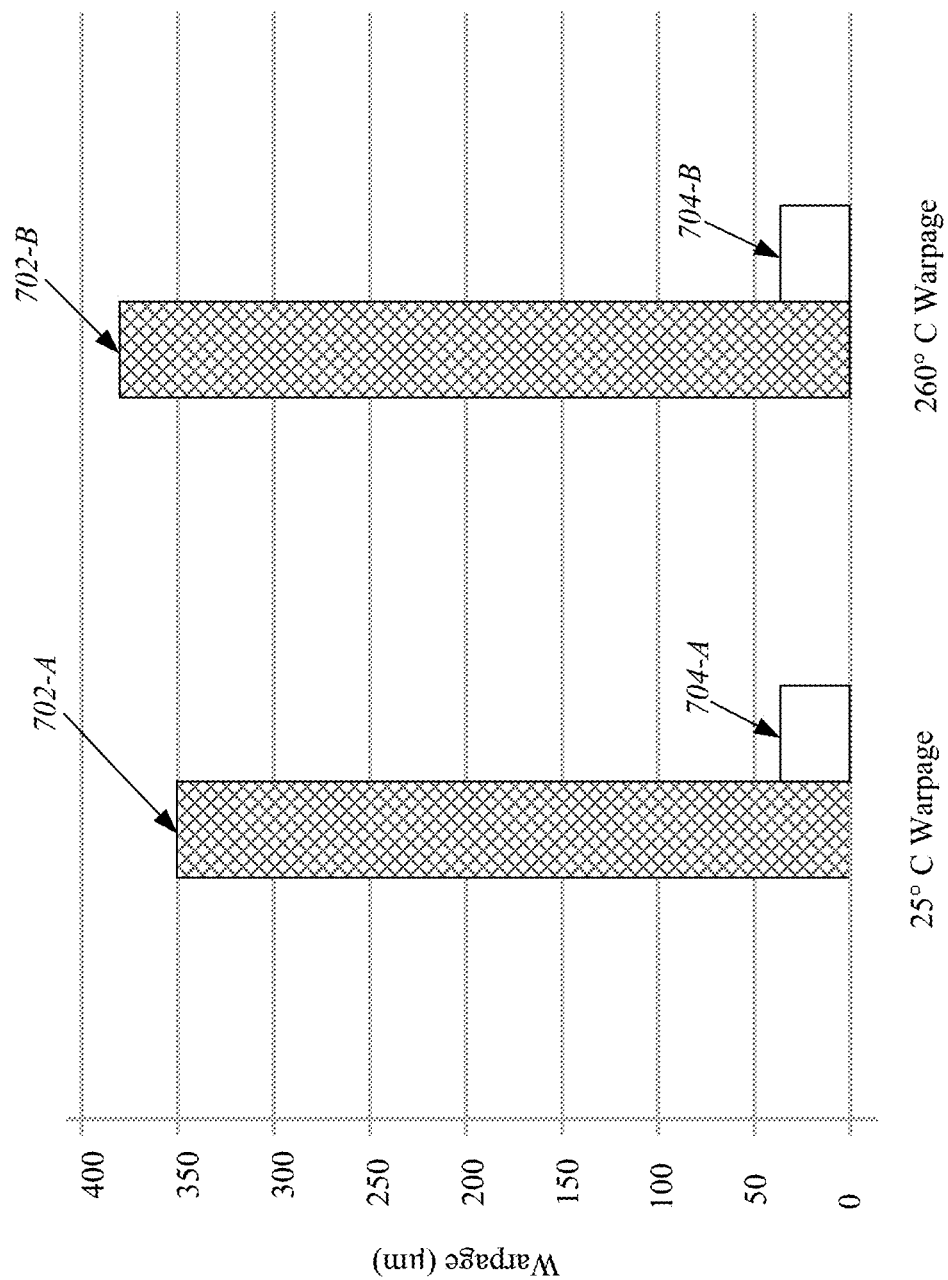
FIG. 7 illustrates warpage control results of an embodiment of a microelectronics package.

FIG. 7 illustrates simulated results comparing warpage control by a package using a stiffener as described herein and a package that does not include a stiffener positioned on a bottom surface of a coreless substrate. For the simulated results, two coreless substrate were used, each with a 117 mm$^2$ die having a thickness of 81 µm attached to a top of the coreless substrates. A silicon stiffener having a thickness of 60 µm and an area of 196 mm$^2$ was attached to a bottom of one of the coreless substrates. Approximately 25% of the surface area of the stiffener was opened for BGA placement. An adhesive having a thickness of approximately 20 µm was used to attach the stiffener to the coreless substrate and cured at a temperature of approximately 150 to 170° C.

Bar 702-A shows the warpage of the coreless substrate that did not include the stiffener at approximately room temperature. As shown, the warpage for the coreless substrate without stiffener is approximately 350 µm.

Bar 704-A shows the warpage of the coreless substrate that did include the stiffener at approximately room temperature. As shown, the warpage for the coreless substrate with stiffener is approximately 40 µm.

Bar 702-B shows the warpage of the coreless substrate that did not include the stiffener at an approximately surface mount reflow temperature. As shown, the warpage for the coreless substrate without stiffener is increased to over approximately 350 µm.

Bar 704-B shows the warpage of the coreless substrate that did include the stiffener at the approximately surface mount reflow temperature. As shown, the warpage for the coreless substrate with stiffener remains at approximately 40 µm. That is, the warpage of the coreless substrate having the silicon stiffener remained largely unchanged across the different temperatures and was significantly less than the warpage experienced by the coreless substrate that did not include a stiffener.

Figure 8:
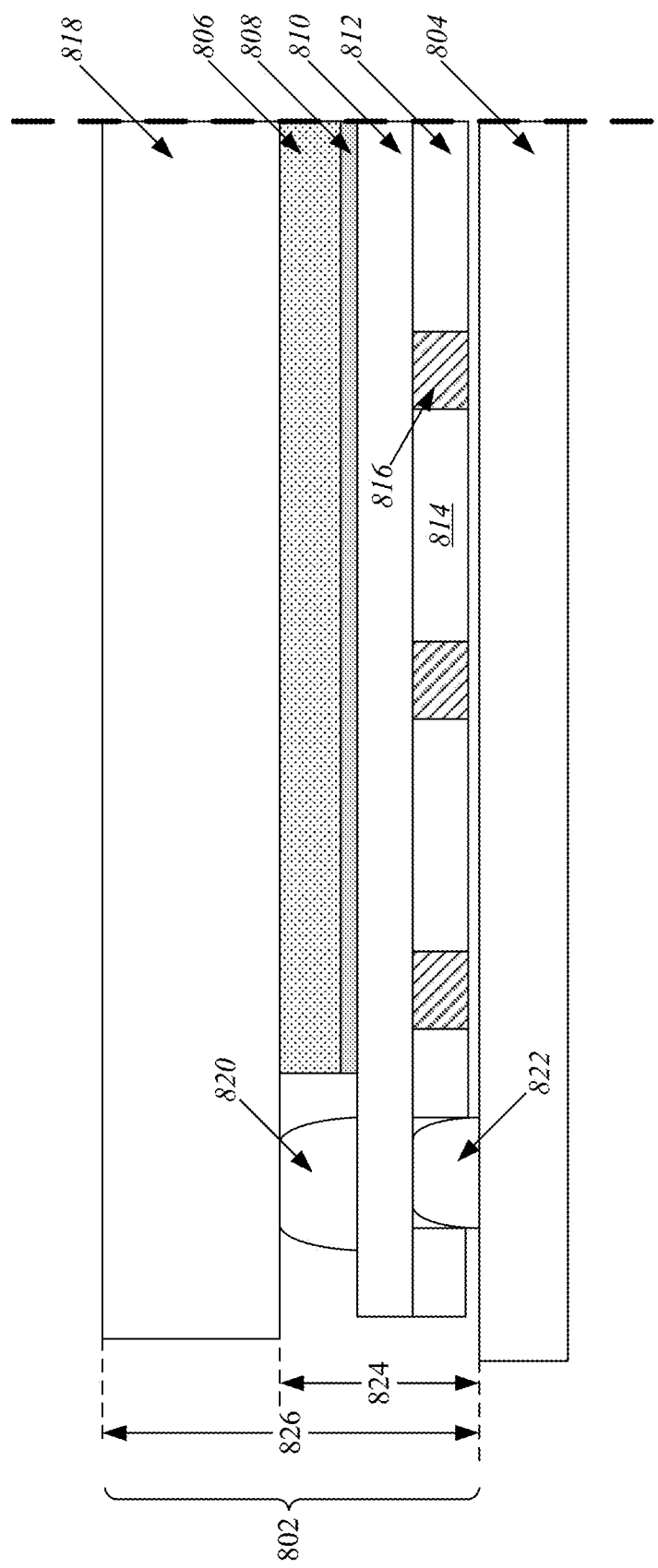
FIG. 8 illustrates a portion of a side view of an embodiment of a microelectronics package.

FIG. 8 illustrates a portion of a package or structure 802 attached to an electronics board 804. The package 802 can be an integrated circuit (IC) package such as a central processing unit (CPU) and/or can be a microelectronics package or structure. The electronics board 804 can be a motherboard. The package 802 can represent an alternative arrangement and process for controlling warpage.

The package 802 can include a die 806. The die 806 can be a microelectronics semiconductor die such as, for example, a silicon die. A first layer or substrate 808 can be adjacent to a bottom surface of the die 806. The first layer or substrate 808 can be a C4 layer or substrate. A second layer or substrate 810 can be adjacent a bottom surface of the C4 substrate 808. The second layer or substrate 810 can be a build-up layer substrate.

A third layer or substrate 812 can be adjacent a bottom surface of the build-up layer substrate 810. The third layer or substrate can be a warpage control substrate. In various embodiments, the warpage control substrate 812 can include glass regions 814 and copper pillar regions 816. The copper pillar regions 816 can be mechanically bonded to the glass regions 814. The CTE of the glass regions can generally approximately match the CTE of the die 806. The copper pillars 816 can increase the effective CTE of the warpage control substrate or layer 812. Solder (not shown for simplicity in FIG. 8) can also be positioned under portions of the substrate 812 including under the copper pillar regions 814. This solder can form solder joints under one or more copper pillar regions 816 that is provided by any solder paste printed on the board 804.

A memory component 818 can be positioned above the die 806. The memory component 818 can be attached or coupled to the build-up layer substrate 810 using PoP multilevel interconnect (MLI) joints 820 The POP MLI joints can be made of solder (e.g., solder balls). The memory component 818 can be any memory device. In various embodiments, the memory component 818 can be a low power double data rate (DDR) dynamic random-access memory (DRAM) (LPDDR) memory such as Mobile DDR or LPDDR4x.

The package 802 can be coupled or attached to the motherboard 804 using input/output (I/O) bumps 822. The I/O bumps can be made of solder (e.g., solder balls). One or more of the various constituent layers forming the package 800 can be coupled or attached together or to an adjacent layer or substrate using adhesives.

The C4 layer 808 and the build-up layer 810 can be considered to be intermediate substrates or layers as they are positioned between the die 806 and the warpage control layer 812.

The warpage control substrate or layer 812 can be used to offset or control warpage that may be experienced by one or more of the other components of the package 802 (e.g., the die 806). By positioning the warpage control layer 812 underneath the build-up layer 810, the warpage control layer 812 can be added to the package 802 without contributing to the z-height of the package 802 (or further increasing the height of the package 802). The number and arrangement of the copper pillars 816 and the solder balls 822 can be optimized to reduce warpage experienced by the package 802 including CTE mismatch from the die 806 as well as other components of the package 802.

In various embodiments, the package 802 can maintain a relatively low z-height despite the addition of the warpage control layer 812. For example, the I/O bumps 822 can have a height of approximately 90 μm, the copper pillars 816 can have a height of approximately 90 μm±20 μm, the build-up layer 810 can have a height of approximately 66 μm, the C4 layer 808 can have a height of approximately 30 μm, the die 806 can have a height of approximately 80 μm, the PoP MLI joints 820 can have a height of approximately 95 μm, and the memory component 818 can have a height of approximately 380 μm, such that a height from a top of the motherboard to a bottom of the memory component 818 (indicated as height 824 in FIG. 8) can be approximately 320 μm (nominal height) and a height from the top of the motherboard to a top of the memory component 818 (indicated as height 826 in FIG. 8) can be approximately 700 μm (nominal height).

Figure 9:
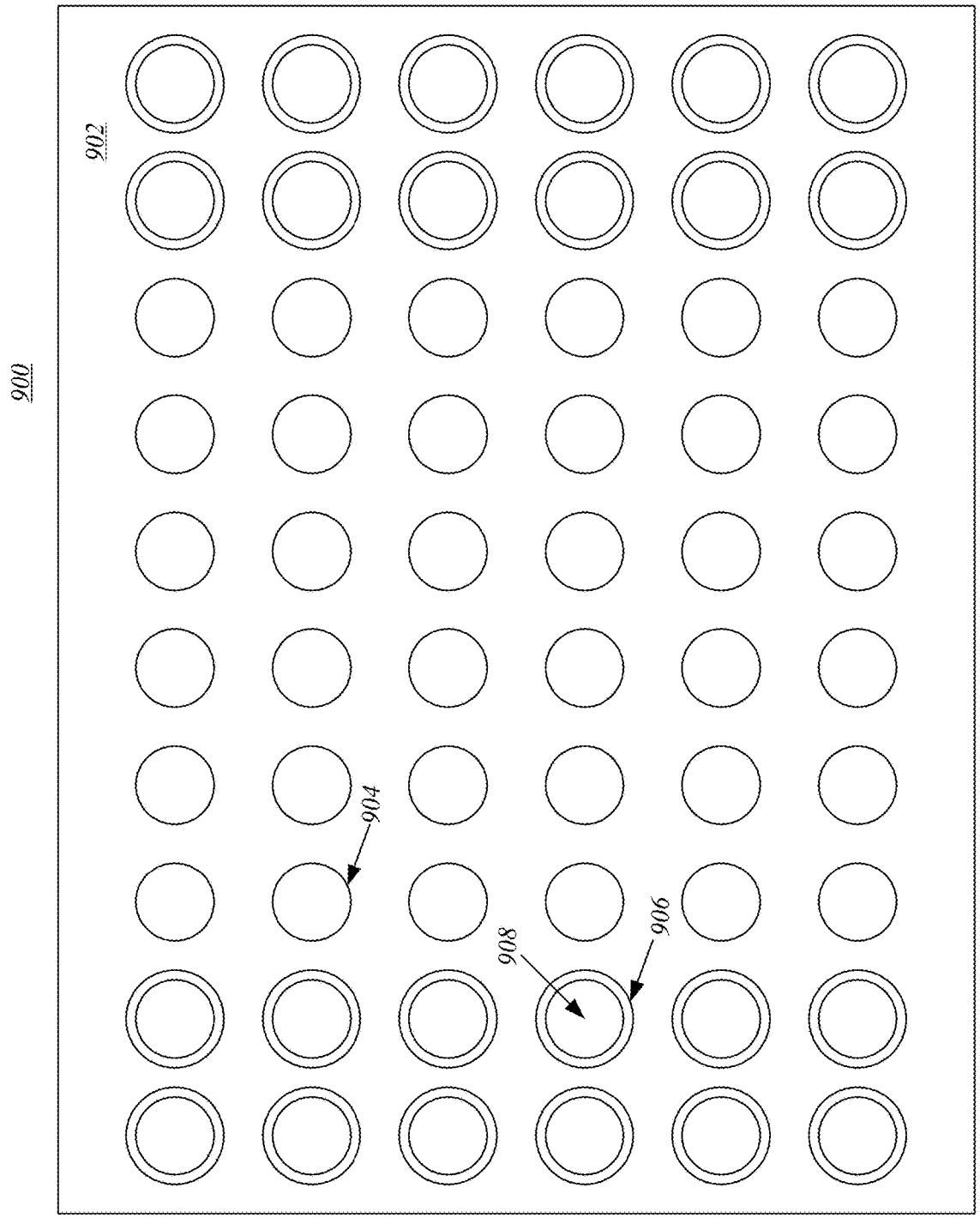
FIG. 9 illustrates a bottom view of an embodiment of a warpage control layer.

FIG. 9 illustrates a bottom view of a warpage control layer 900. The warpage control layer 900 can represent the warpage control layer 812 shown in FIG. 8. The warpage control layer 900 can include a glass substrate 902 that includes copper pillar segments 904 positioned within an interior portion of the warpage control layer 900. In various embodiments, materials other than copper can be used for the pillars 904. Open spaces 906 can be positioned at an outer portion of the warpage control layer 900. The open spaces 906 can provide areas for second level interconnects (SLIs), in particular, solder balls 908. The solder balls 908 can represent the I/O bumps 822 depicted in FIG. 8. Further, the copper pillars 904 can represent the copper pillars 816 depicted in FIG. 8. The thickness or height of the warpage control layer 900, and in particular the thickness or height of the glass substrate 902, can be approximately the same height as the die of a package of which the warpage control layer 900 is a part (e.g., a height of the die 806 of the package 802 as depicted in FIG. 8).

The copper pillars 904 and the open spaces 906 can generally be formed into rounded or circular shapes but are not so limited. The copper pillars 904 and the open spaces 906 can be arranged to form any pattern on the glass substrate 902. In general, the copper pillars 904 and the open spaces 906 can form an array of any size (e.g., any number of rows or columns). As shown in FIG. 9, the opens spaces 906 can include the two outer columns on either side of the glass substrate 902 but are not so limited. In various embodiments, the open spaces 906 and the solder balls may occupy only one outer column on either side of the glass substrate 902.

The solder balls/solder joints 908 positioned on a periphery of the glass substrate 902 can be full solder joints to enable improved solder joint reliability. The copper pillars 904 can provide for improved warpage balance. Laser drilling can be used to form the array used for the copper pillars 904 and the open spaces 906. In various embodiments, depending on warpage requirements, one or more of the copper pillars 904 and the open spaces 906/solder balls 908 can be eliminated.

The package 802—in particular, introduction of the warpage control layer 812 as shown in FIG. 8 and as represented as warpage control layer 902 in FIG. 9—provides numerous benefits over conventional techniques for reducing warpage. First, the techniques and structures described herein do not contribute to z-height, thereby reducing stack-up height significantly. Second, glass materials that can be used as part of the techniques and structures described herein are readily available and have a CTE that approximately matches that of a die used in the combined package (e.g., generally on the order of $3 \cdot 10^{-6}/°$ C.). Third, the architecture shown in FIG. 8 enables direct memory attach without pre-stacking. Fourth, well known adhesives can be used between the warpage control layer (e.g., the warpage control layer 812) and any adjacent layers (e.g., the build-up layer 810).

FIGS. 10a-f illustrate a process for fabricating a portion of the package 802 illustrated in FIG. 8. In particular, FIGS. 10a-f illustrates a process for fabricating the warpage control layer 812 and the build-up layer 810.

Figure 10A:
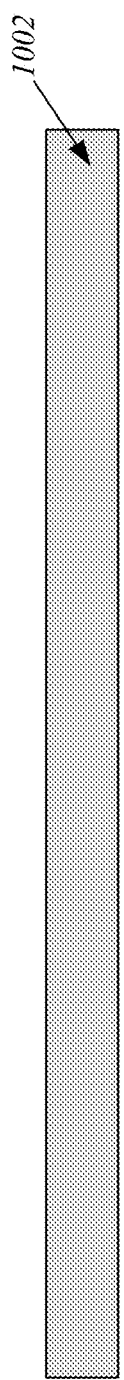
Figure 10B:
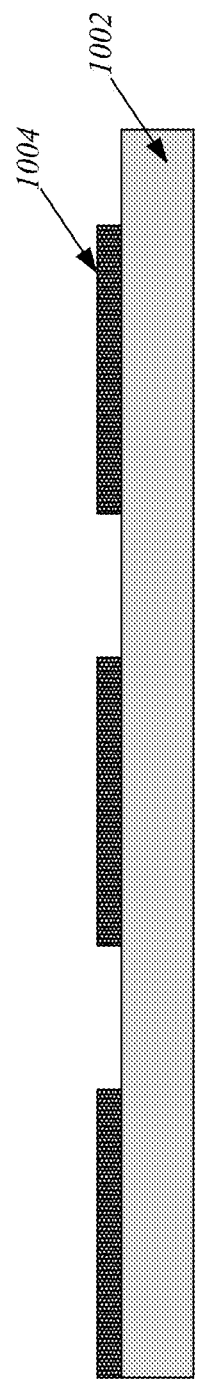

As shown in FIG. 10A, a glass base 1002 or other base comprising another material can be provided. In FIG. 10B, the glass base 1002 is shown with a copper layer 1004. The copper layer 1004 can be positioned onto a surface of the glass base 1002. The copper layer 1004 can cover any portion of the glass base 1002. The copper layer 1004 can be positioned onto the glass base 1002 by, for example, laminating, depositing, or plating the glass base 1002 with the copper layer 1004. The copper layer 1004 can include one or more distinct non-connected portions of copper attached to the glass base 1002. Alternatively, the copper layer 10004 can cover an entire surface of the glass base 1002.

Figure 10C:
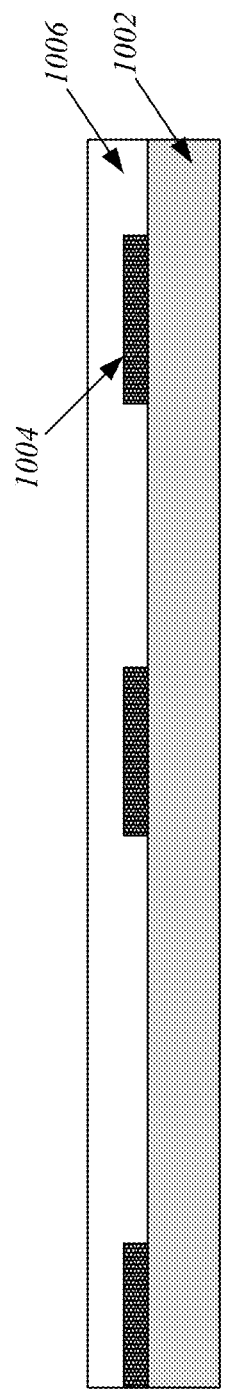

As shown in FIG. 10C the copper layer 1004 can be modified. Specifically, the copper layer 1004 can be modified by lithography or etching techniques to modify the originally deposited copper layer 1004 (as shown in FIG. 10B) into any desired pattern, size, and/or shape. In various embodiments, the copper layer 1004 can be modified to form one or more copper connection pads. Further, as shown in FIG. 10C, a build-up layer 1006 can be positioned onto the glass base 1002. In various embodiments, the build-up layer 1006 can be provided by lamination and/or etching to form a layer adjacent to the glass base 1002 and the copper layer 1004. For example, the build-up layer 1006 can be positioned over the glass base 1002 and the copper layer/copper pads 1004.

As shown in FIG. 10D, the arrangement of the glass base 1002, the copper layer 1004, and the build-up layer 1006 can be flipped. Further, in various embodiments, depending on the choice of glass used for the glass base 1002, openings 1008 can be made in the glass base 1002. The openings 1008 can be made to accommodate copper pillars and/or solder balls. The openings 1008 can be made in the glass base 1002 by photoresist coating and etching of the glass base 1002. The openings 1008 can also be made by laser drilling. In various embodiments, the glass base 1002 can be originally formed to include the openings 1008 through, for example, a photoresist and etching process. The openings 1008 can be positioned so as to be aligned with the copper layer/copper pads 1004.

As shown in FIG. 10E, copper pillars 1010 can be deposited or grown in certain openings 1008. The copper pillars 1010 can be provided to approximately a height of the glass base 1002. Certain openings 1008 may not be used for copper pillars 1010 and may be reserved for solder balls. A dry film resist (DFR) layer 1112 can be positioned over the glass base 1002. In various embodiments, the DFR layer 1112 can be positioned over portions of the glass base 1002 so as to expose the copper pillars 1008. Further, the DFR layer 1112 can be positioned over openings 1008 that are not intended to house copper pillars 1010. The DRF layer 1112 can be a protection layer and can provide protection for the openings 1008 where a copper pillar is not deposited. The arrangement depicted in FIG. 10E can be stored until ready for use including subsequent chip attach processes.

In FIG. 10F, the DFR layer 1112 can be removed. The glass base 1002 can once again be flipped and prepared for subsequent processing steps including chip attach (e.g., attaching a die to the build-up layer 1006), ball attach (e.g., within the opening 1008), and singulation of the glass base 1002 (e.g., in embodiments where the arrangement depicted in FIG. 10F is fabricated in bulk and singulated for subsequent individual use). The glass base 1002, the build-up layer 1006, the opening 1008, and the copper pillars 1010 can represent the build-up layer 810 and the warpage control layer 812 as depicted in FIG. 8. Further, the glass base 1002, the opening 1008, and the copper pillars 1010 can represent the warpage control layer 812 in particular. The glass base 1002, the opening 1008, and the copper pillars 1010 can also represent the warpage control layer 900 with copper pillars 1010 representing the copper pillars 904 and the opening 1008 representing a space to accept the solder balls 908.

Figure 11:
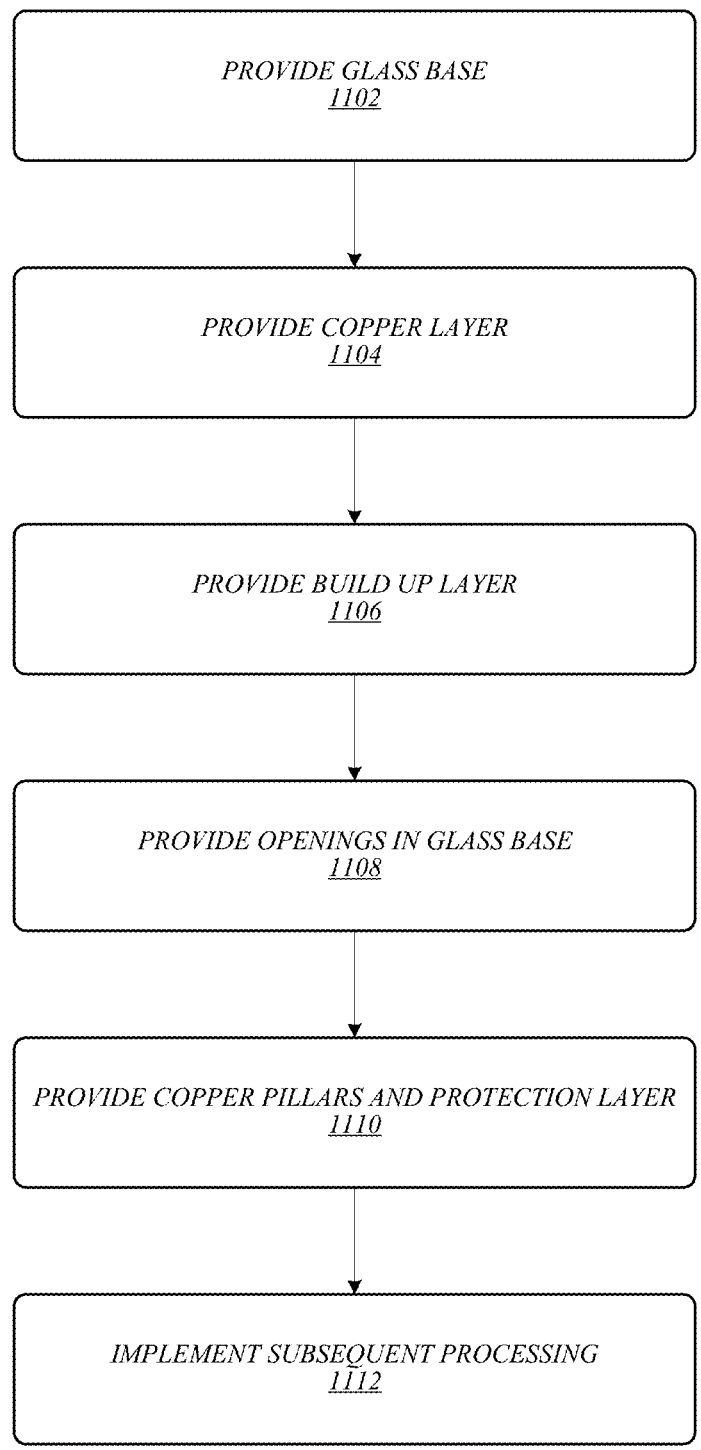
FIG. 11 illustrates an embodiment of a second logic flow.

FIG. 11 illustrates an example of a logic flow 1100 that may be representative of a process for forming a portion of a package having improved warpage control and low z-height. For example, logic flow 1100 may be representative of operations that may be performed to form a portion of the package 800 or warpage control layer 900 as shown and described in relations to FIGS. 8 and 9, respectively.

At 1102, a glass base is provided. At 1104, a copper layer can be provided on the glass base. The copper layer can cover any portion of the glass base. The copper layer can be added by laminating, depositing, or plating the copper layer onto a surface of the glass base. Any pattern or arrangement can be formed into the copper layer by lithographic and etching techniques.

At 1106, on or more build-up layers can be provided. The build-up layers can be positioned onto the glass base on a same surface side as the copper layer. The build-up layers can be provided by lamination AND etching techniques.

At 1108, one or more openings can be formed into the glass base. The openings can be made by laser drilling or can be formed by photoresist coating and etching techniques. In various embodiments, the initially provided glass base can be formed through photo-definable techniques. The openings can be provided to form any desired pattern or arrangement, such as the arrangement shown in FIG. 9. The openings can be used in subsequent processing steps for placement of copper pillars or solder balls.

At 1110, copper pillars can be provided in certain openings in the glass base. The copper pillars can be provided to make contact with a portion of the copper layer. A portion of the openings can be reserved for subsequent filling by solder balls. The glass base can be covered by a protection layer such as, for example, a DFR layer. The DFR layer can be positioned over the glass base over portions where the copper pillars are not present and over openings reserved for subsequent filling by solder balls.

At 1112, subsequent processing can be performed. Subsequent processing can include singulation, removal of the DFR layer, solder ball attach and attachment to a motherboard, die attach, and/or attachment to one or more additional layers.

The following examples pertain to further embodiments:

Example 1 is a microelectronics package comprising a microelectronics die, one or more intermediate substrates positioned under the microelectronics die, and a warpage control layer positioned under the one or more intermediate substrates.

Example 2 is an extension of Example 1 or any other example disclosed herein, wherein the one or more intermediate substrates includes a coreless substrate.

Example 3 is an extension of Example 2 or any other example disclosed herein, wherein the microelectronics die is attached to a top surface of the coreless substrate and the warpage control layer is attached to a bottom surface of the coreless substrate.

Example 4 is an extension of Example 3 or any other example disclosed herein, wherein the warpage control layer is attached to the bottom surface of the coreless substrate by an adhesive.

Example 5 is an extension of Example 4 or any other example disclosed herein, wherein the coreless substrate includes one or more package-on-package (PoP) connection pads positioned on the top surface of the coreless substrate.

Example 6 is an extension of Example 4 or any other example disclosed herein, wherein the coreless substrate includes one or more ball grid array (BGA) connection pads on the bottom surface of the coreless substrate.

Example 7 is an extension of Example 4 or any other example disclosed herein, wherein the warpage control layer comprises a stiffener.

Example 8 is an extension of Example 7 or any other example disclosed herein, wherein the stiffener comprises a metallic stiffener.

Example 9 is an extension of Example 8 or any other example disclosed herein, wherein the metallic stiffener comprises stainless steel.

Example 10 is an extension of Example 7 or any other example disclosed herein, wherein the stiffener comprises an insulating stiffener.

Example 11 is an extension of Example 10 or any other example disclosed herein, wherein the insulating stiffener comprises glass.

Example 12 is an extension of Example 10 or any other example disclosed herein, wherein the insulating stiffener comprises silicon.

Example 13 is an extension of Example 7 or any other example disclosed herein, wherein the stiffener includes open spaces for solder for connection to the BGA connection pads.

Example 14 is an extension of Example 7 or any other example disclosed herein, wherein a thickness of the stiffener is approximately equal to a thickness of the microelectronics die.

Example 15 is an extension of Example 7 or any other example disclosed herein, wherein a coefficient of thermal expansion (CTE) of the stiffener is approximately equal to a CTE of the microelectronics die.

Example 16 is an extension of Example 1 or any other example disclosed herein, wherein the one or more intermediate substrates includes a C4 layer and a build-up layer.

Example 17 is an extension of Example 16 or any other example disclosed herein, wherein the C4 layer is attached to a bottom surface of the microelectronics die and the build-up layer is attached to a bottom surface of the C4 layer.

Example 18 is an extension of Example 17 or any other example disclosed herein, wherein the warpage control layer is attached to a bottom surface of the build-up layer.

Example 19 is an extension of Example 18 or any other example disclosed herein, wherein the warpage control layer comprises a glass substrate.

Example 20 is an extension of Example 19 or any other example disclosed herein, wherein the glass substrate includes copper pillar segments.

Example 21 is an extension of Example 19 or any other example disclosed herein, wherein the copper pillar segments are positioned on an interior of the glass substrate and one or more openings for solder are positioned on a periphery of the glass substrate.

Example 22 is an extension of Example 18 or any other example disclosed herein, wherein a thickness of the warpage control layer is approximately equal to a thickness of the microelectronics die.

Example 23 is an extension of Example 18 or any other example disclosed herein, wherein a CTE of the glass substrate is approximately equal to a CTE of the microelectronics die.

Example 24 is an extension of Example 1 or any other example disclosed herein, further including a memory component attached to a top surface of at least one of the one or more intermediate substrates and over the microelectronics die.

Example 25 is an extension of Example 1 or any other example disclosed herein, further including a motherboard attached to a bottom surface of at least one of the one or more intermediate substrates such that the warpage control layer is positioned in a space between the bottom surface and the motherboard.

Example 26 a method of fabricating a microelectronic device comprising attaching a microelectronics die to a top surface of a coreless substrate, attaching a stiffener to a bottom surface of the coreless substrate using an adhesive, attaching solder to the bottom surface of the coreless substrate, and attaching the microelectronics die, coreless substrate, and stiffener to a motherboard using the solder, wherein the stiffener is positioned between the motherboard and the coreless substrate.

Example 27 is an extension of Example 26 or any other example disclosed herein, further comprising selecting a thickness of the stiffener to be approximately equal to a thickness of the microelectronics die.

Example 28 is an extension of Example 26 or any other example disclosed herein, further comprising selecting a coefficient of thermal expansion (CTE) of the stiffener to approximately equal a CTE of the microelectronics die.

Example 29 is an extension of Example 26 or any other example disclosed herein, further comprising selecting the stiffener to be an insulating stiffener.

Example 30 is an extension of Example 29 or any other example disclosed herein, further comprising laser drilling the insulating stiffener after attaching the insulating stiffener to the coreless substrate to form openings in the insulating substrate for the solder.

Example 31 is an extension of Example 26 or any other example disclosed herein, further comprising selecting the stiffener to be a metallic stiffener.

Example 32 is an extension of Example 31 or any other example disclosed herein, further comprising laser drilling the metallic stiffener prior to attaching the metallic stiffener to the coreless substrate to form openings in the metallic substrate for the solder.

Example 33 is an extension of Example 26 or any other example disclosed herein, further comprising attaching a memory component to the top surface of the coreless substrate over the microelectronics die.

Example 34 is a method of fabricating a microelectronic device comprising providing a glass base, forming copper pads on a top surface of the glass base, forming a build-up layer on the top surface of the glass base and over the copper pads, forming openings in the glass base aligned with the copper pads, providing copper pillar segments in one or more interior openings of the glass base, attaching a microelectronics die to the build-up layer, depositing solder in one or more outer openings in the glass base, and attaching the build-up layer to a motherboard using the solder such that the glass base is positioned between the motherboard and the build-up layer.

Example 35 is an extension of Example 34 or any other example disclosed herein, wherein forming the copper pads comprises depositing a copper layer and etching the copper layer.

Example 36 is an extension of Example 34 or any other example disclosed herein, wherein forming the build-up layer comprises laminating the build-up layer to the glass base.

Example 37 is an extension of Example 34 or any other example disclosed herein, wherein forming the openings comprises etching the glass base.

Example 38 is an extension of Example 34 or any other example disclosed herein, wherein forming the openings comprises laser drilling the glass base.

Example 39 is an extension of Example 34 or any other example disclosed herein, wherein the openings form an array.

Example 40 is an extension of Example 34 or any other example disclosed herein, wherein a height of each of the copper pillar segments is approximately equal to a thickness of the glass base.

Example 41 is an extension of Example 34 or any other example disclosed herein, wherein a thickness of the glass substrate is approximately equal to a thickness of the microelectronics die.

Example 42 is an extension of Example 34 or any other example disclosed herein, wherein attaching the microelectronics die to the build-up layer comprises attaching the microelectronics die to a C4 layer that is attached to the build-up layer.

Example 43 is an extension of Example 34 or any other example disclosed herein, wherein a coefficient of thermal expansion (CTE) of the glass base approximately matches a CTE of the microelectronics die.

Numerous specific details have been set forth herein to provide a thorough understanding of the embodiments. It will be understood by those skilled in the art, however, that the embodiments may be practiced without these specific details. In other instances, well-known operations, components, and structures have not been described in detail so as not to obscure the embodiments. It can be appreciated that the specific structural and functional details disclosed herein may be representative and do not necessarily limit the scope of the embodiments.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

As used herein, the terms "over", "to", "between" and "on" may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Further, the terms "attached" and "coupled" may mean directly adjacent to or in direct contact with another element or may mean in a close physical relationship with another element without being directly adjacent to or in direct contact with the other element.

The microelectronics packages and/or warpage control layers described herein along with the techniques for warpage control described herein can be implemented in or can be part of any processor within any computing device. The term "processor" may refer to any device or portion of a device that processes electronic data from registers and/or memory to transform that electronic data into other electronic data that may be stored in registers and/or memory. In various embodiments, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further embodiments, the computing device may be any other electronic device that processes data.

Further, embodiments herein may describe layers as positioned under or on top of another layer but are not so limited. Such descriptions may be relative to a particular orientation of the described layers as shown in one or more figures provided herein. Accordingly, descriptions relating to a layer on top of or below another layer may also be described as being on a first (e.g., lateral) side or a second opposite side of another layer.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A microelectronics package, comprising:
   a microelectronics die;
   a warpage control layer comprising at least one stiffener, wherein:
      a thickness of the stiffener is approximately equal to a thickness of the microelectronics die, and
      a coefficient of thermal expansion (CTE) of the stiffener is approximately equal to a CTE of the microelectronics die;
   a coreless substrate positioned between the microelectronics die and the warpage control layer; and
   a plurality of ball grid array (BGA) connection pads disposed on the bottom surface of the coreless substrate, wherein the at least one stiffener comprises a plurality of openings associated with the plurality of BGA connection pads.

2. The microelectronics package of claim 1, wherein the microelectronics die is attached to a top surface of the coreless substrate, and wherein the warpage control layer is attached to a bottom surface of the coreless substrate by an adhesive.

3. The microelectronics package of claim 1, wherein the stiffener comprises a metallic stiffener.

4. The microelectronics package of claim 1, wherein the stiffener comprises an insulating stiffener.

5. The microelectronics package of claim 1, the coreless substrate comprising one or more intermediate substrates, wherein the one or more intermediate substrates includes a C4 layer and a build-up layer, wherein the C4 layer is attached to a bottom surface of the microelectronics die and the build-up layer is attached to a bottom surface of the C4 layer, and wherein the warpage control layer is attached to a bottom surface of the build-up layer.

6. The microelectronics package of claim 1, wherein the warpage control layer comprises a glass substrate.

7. The microelectronics package of claim 6, wherein the glass substrate includes copper pillar segments.

8. The microelectronics package of claim 7, wherein the copper pillar segments are positioned on an interior of the glass substrate and one or more openings for solder are positioned on a periphery of the glass substrate.

9. The microelectronics package of claim 1, wherein a thickness of the warpage control layer is approximately equal to a thickness of the microelectronics die.

10. The microelectronics package of claim 6, wherein a CTE of the glass substrate is approximately equal to a CTE of the microelectronics die.

11. The microelectronics package of claim 1, the coreless substrate comprising one or more intermediate substrates, further including a motherboard attached to a bottom surface of at least one of the one or more intermediate substrates such that the warpage control layer is positioned between the bottom surface and the motherboard.

12. A system, comprising:
   a microelectronics die;
   a warpage control layer comprising at least one stiffener, wherein:
      a thickness of the stiffener is approximately equal to a thickness of the microelectronics die, and
      a coefficient of thermal expansion (CTE) of the stiffener is approximately equal to a CTE of the microelectronics die;

a coreless substrate positioned between the microelectronics die and the warpage control layer;

a plurality of ball grid array (BGA) connection pads disposed on the bottom surface of the coreless substrate, wherein the at least one stiffener comprises a plurality of openings associated with the plurality of BGA connection pads; and memory circuitry coupled to the microelectronic die.

13. The system of claim 12, wherein the microelectronics die is attached to a top surface of the coreless substrate, and wherein the warpage control layer is attached to a bottom surface of the coreless substrate by an adhesive.

14. The system of claim 12, wherein the stiffener comprises a metallic stiffener or an insulating stiffener.

15. The system of claim 12, the coreless substrate comprising one or more intermediate substrates, wherein the one or more intermediate substrates includes a C4 layer and a build-up layer, wherein the C4 layer is attached to a bottom surface of the microelectronics die and the build-up layer is attached to a bottom surface of the C4 layer, and wherein the warpage control layer is attached to a bottom surface of the build-up layer.

16. The system of claim 12, wherein a thickness of the warpage control layer is approximately equal to a thickness of the microelectronics die.

17. The system of claim 12, wherein the warpage control layer comprises a glass substrate.

18. The system of claim 17, wherein the glass substrate includes copper pillar segments.

19. The system of claim 18, wherein the copper pillar segments are positioned on an interior of the glass substrate and one or more openings for solder are positioned on a periphery of the glass substrate.

* * * * *